United States Patent
Ryan (10) Patent No.: US 7,805,586 B2
(45) Date of Patent: Sep. 28, 2010

(54) SYSTEM AND METHOD FOR OPTIMIZING INTERCONNECTIONS OF MEMORY DEVICES IN A MULTICHIP MODULE

(75) Inventor: Kevin J. Ryan, Eagle, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 11/432,013

(22) Filed: May 10, 2006

(65) Prior Publication Data
US 2006/0206667 A1 Sep. 14, 2006

Related U.S. Application Data

(63) Continuation of application No. 10/232,842, filed on Aug. 29, 2002.

(51) Int. Cl.
*G06F 12/00* (2006.01)
*G06F 13/00* (2006.01)
*G06F 13/28* (2006.01)

(52) U.S. Cl. ............... 711/170; 711/115; 711/E12.084
(58) Field of Classification Search ........... 711/115, 711/170
See application file for complete search history.

(56) References Cited

U.S. PATENT DOCUMENTS

| | | | |
|---|---|---|---|
| 3,742,253 A | 6/1973 | Kronies | 307/247 |
| 3,777,154 A | 12/1973 | Lindsey | 250/227 |
| 4,045,781 A | 8/1977 | Levy et al. | 364/200 |
| 4,240,143 A | 12/1980 | Besemer et al. | 364/200 |
| 4,245,306 A | 1/1981 | Besemer et al. | 364/200 |
| 4,253,144 A | 2/1981 | Bellamy et al. | 364/200 |
| 4,253,146 A | 2/1981 | Bellamy et al. | 364/200 |
| 4,443,845 A | 4/1984 | Hamilton et al. | 364/200 |
| 4,608,702 A | 8/1986 | Hirzel et al. | 375/110 |
| 4,707,823 A | 11/1987 | Holdren et al. | 370/1 |

(Continued)

FOREIGN PATENT DOCUMENTS

EP 0849685 A2 6/1998

(Continued)

OTHER PUBLICATIONS

Depari, A. et al., "*USB Sensor Network For Industrial Applications*", IEEE Xplore, May 2004 (Abstract Only).

(Continued)

*Primary Examiner*—Sheng-Jen Tsai
(74) *Attorney, Agent, or Firm*—Dorsey & Whitney LLP (57) ABSTRACT

An apparatus and method couples memory devices in a memory module to a memory hub on the module such that signals traveling from the hub to the devices have the same propagation time regardless of which device is involved. The hub receives memory signals from a controller over a high speed data link which the hub translates into electrical data, command and address signals. These signals are applied to the memory devices over busses having equivalent path lengths. The busses may also be used by the memory devices to apply data signals to the memory hub. Such data signals can be converted by the memory hub into memory signals and applied to the controller over the high speed data link. In one example, the memory hub is located in the center of the memory module.

30 Claims, 4 Drawing Sheets

U.S. PATENT DOCUMENTS

| | | | |
|---|---|---|---|
| 4,724,520 A | 2/1988 | Athanas et al. | 364/200 |
| 4,809,232 A | 2/1989 | Baumbaugh et al. | 365/221 |
| 4,813,772 A | 3/1989 | Kowel et al. | 350/388 |
| 4,823,403 A | 4/1989 | Twietmeyer | 455/607 |
| 4,825,208 A | 4/1989 | Mueller et al. | 340/825.02 |
| 4,831,520 A | 5/1989 | Rubinfeld et al. | 364/200 |
| 4,891,808 A | 1/1990 | Williams | 370/112 |
| 4,930,128 A | 5/1990 | Suzuki et al. | 371/12 |
| 4,953,930 A | 9/1990 | Ramsey et al. | 350/96.11 |
| 5,241,506 A | 8/1993 | Motegi et al. | 365/210 |
| 5,243,703 A | 9/1993 | Farmwald et al. | 395/325 |
| 5,251,303 A | 10/1993 | Fogg, Jr. et al. | 395/275 |
| 5,269,022 A | 12/1993 | Shinjo et al. | 395/700 |
| 5,307,381 A * | 4/1994 | Ahuja | 375/356 |
| 5,313,590 A | 5/1994 | Taylor | 395/325 |
| 5,317,752 A | 5/1994 | Jewett et al. | 395/750 |
| 5,319,755 A | 6/1994 | Farmwald et al. | 395/325 |
| 5,327,553 A | 7/1994 | Jewett et al. | 395/575 |
| 5,355,391 A | 10/1994 | Horowitz et al. | 375/36 |
| 5,379,382 A | 1/1995 | Work et al. | 395/275 |
| 5,414,819 A | 5/1995 | Redmond et al. | 395/325 |
| 5,423,009 A | 6/1995 | Zhu | 710/307 |
| 5,432,823 A | 7/1995 | Gasbarro et al. | 375/356 |
| 5,432,907 A | 7/1995 | Picazo, Jr. et al. | 395/200 |
| 5,442,770 A | 8/1995 | Barratt | 395/403 |
| 5,461,627 A | 10/1995 | Rypinski | 370/95.2 |
| 5,465,229 A | 11/1995 | Bechtolsheim et al. | 345/477 |
| 5,479,370 A | 12/1995 | Furuyama et al. | 365/189.12 |
| 5,493,437 A | 2/1996 | Lebby et al. | 359/152 |
| 5,497,476 A | 3/1996 | Oldfield et al. | 395/439 |
| 5,502,621 A | 3/1996 | Schumacher et al. | 361/760 |
| 5,532,856 A | 7/1996 | Li et al. | 359/118 |
| 5,544,319 A * | 8/1996 | Acton et al. | 709/246 |
| 5,544,345 A | 8/1996 | Carpenter et al. | 395/477 |
| 5,566,325 A | 10/1996 | Bruce, II et al. | 395/494 |
| 5,568,574 A | 10/1996 | Tanguay, Jr. et al. | 385/14 |
| 5,577,220 A | 11/1996 | Combs et al. | 395/416 |
| 5,581,767 A | 12/1996 | Katsuki et al. | 395/800 |
| 5,606,717 A | 2/1997 | Farmwald et al. | 395/856 |
| 5,608,264 A | 3/1997 | Gaul | 257/734 |
| 5,623,534 A | 4/1997 | Desai et al. | 379/59 |
| 5,638,334 A | 6/1997 | Farmwald et al. | 365/230.03 |
| 5,638,534 A | 6/1997 | Mote, Jr. | 395/485 |
| 5,659,798 A | 8/1997 | Blumrich et al. | 395/846 |
| 5,687,325 A | 11/1997 | Chang | 395/284 |
| 5,706,224 A | 1/1998 | Srinivasan et al. | 365/49 |
| 5,710,733 A | 1/1998 | Chengson et al. | 365/52 |
| 5,715,456 A | 2/1998 | Bennett et al. | 395/652 |
| 5,729,709 A | 3/1998 | Harness | 395/405 |
| 5,748,616 A | 5/1998 | Riley | 370/242 |
| 5,787,475 A | 7/1998 | Pawlowski | 711/137 |
| 5,796,413 A | 8/1998 | Shipp et al. | 345/522 |
| 5,808,897 A | 9/1998 | Miller, Jr. et al. | 364/490 |
| 5,818,844 A | 10/1998 | Singh et al. | 370/463 |
| 5,818,984 A | 10/1998 | Ahmad et al. | 385/14 |
| 5,819,304 A | 10/1998 | Nilsen et al. | 711/5 |
| 5,822,255 A | 10/1998 | Uchida | 365/194 |
| 5,831,467 A | 11/1998 | Leung et al. | 327/319 |
| 5,832,250 A | 11/1998 | Whittaker | 395/471 |
| 5,872,944 A | 2/1999 | Goldrian et al. | 395/306 |
| 5,875,352 A | 2/1999 | Gentry et al. | 395/843 |
| 5,875,454 A | 2/1999 | Craft et al. | 711/113 |
| 5,887,159 A | 3/1999 | Burrows | 395/567 |
| 5,889,714 A | 3/1999 | Schumann et al. | 365/203 |
| 5,928,343 A | 7/1999 | Farmwald et al. | 710/104 |
| 5,963,942 A | 10/1999 | Igata | 707/6 |
| 5,966,724 A | 10/1999 | Ryan | 711/105 |
| 5,973,935 A | 10/1999 | Schoenfeld et al. | 361/813 |
| 5,973,951 A | 10/1999 | Bechtolsheim et al. | 365/52 |
| 5,978,567 A | 11/1999 | Rebane et al. | 395/200.49 |
| 5,987,196 A | 11/1999 | Noble | 385/14 |
| 6,011,741 A | 1/2000 | Wallace et al. | 365/221 |
| 6,023,726 A | 2/2000 | Saksena | 709/219 |
| 6,026,226 A | 2/2000 | Heile et al. | 395/500.13 |
| 6,029,250 A | 2/2000 | Keeth | 713/400 |
| 6,031,241 A | 2/2000 | Silfvast et al. | 250/504 R |
| 6,033,951 A | 3/2000 | Chao | 438/253 |
| 6,038,630 A | 3/2000 | Foster et al. | 710/132 |
| 6,061,263 A | 5/2000 | Boaz et al. | 365/51 |
| 6,061,296 A | 5/2000 | Ternullo, Jr. et al. | 365/233 |
| 6,067,262 A | 5/2000 | Irrinki et al. | 365/201 |
| 6,067,649 A | 5/2000 | Goodwin | 714/718 |
| 6,073,190 A | 6/2000 | Rooney | 710/56 |
| 6,076,139 A | 6/2000 | Welker et al. | 711/104 |
| 6,078,451 A | 6/2000 | Ioki | 360/51 |
| 6,079,008 A | 6/2000 | Clery, III | 712/11 |
| 6,088,774 A | 7/2000 | Gillingham | 711/167 |
| 6,092,158 A | 7/2000 | Harriman et al. | 711/151 |
| 6,098,158 A | 8/2000 | Lay et al. | 711/162 |
| 6,101,151 A | 8/2000 | Watanabe et al. | 365/233 |
| 6,105,075 A | 8/2000 | Ghaffari | 710/5 |
| 6,105,088 A | 8/2000 | Pascale et al. | 710/100 |
| 6,111,757 A | 8/2000 | Dell et al. | 361/737 |
| 6,125,431 A | 9/2000 | Kobayashi | 711/154 |
| 6,128,703 A | 10/2000 | Bourekas et al. | 711/138 |
| 6,131,149 A | 10/2000 | Lu et al. | 711/167 |
| 6,134,624 A | 10/2000 | Burns et al. | 710/131 |
| 6,137,709 A | 10/2000 | Boaz et al. | 365/51 |
| 6,144,327 A | 11/2000 | Distinti et al. | 341/126 |
| 6,144,587 A | 11/2000 | Yoshida | 365/189.05 |
| 6,167,465 A | 12/2000 | Parvin et al. | 710/22 |
| 6,167,486 A | 12/2000 | Lee et al. | 711/120 |
| 6,175,571 B1 | 1/2001 | Haddock et al. | 370/423 |
| 6,185,352 B1 | 2/2001 | Hurley | 385/114 |
| 6,185,676 B1 | 2/2001 | Poplingher et al. | 712/239 |
| 6,186,400 B1 | 2/2001 | Dvorkis et al. | 235/462.45 |
| 6,191,663 B1 | 2/2001 | Hannah | 333/17.3 |
| 6,201,724 B1 | 3/2001 | Ishizaki et al. | 365/49 |
| 6,208,180 B1 | 3/2001 | Fisch et al. | 327/141 |
| 6,219,725 B1 | 4/2001 | Diehl et al. | 710/26 |
| 6,223,301 B1 | 4/2001 | Santeler et al. | 714/6 |
| 6,226,729 B1 | 5/2001 | Stevens et al. | 711/171 |
| 6,229,712 B1 | 5/2001 | Munoz-Bustamante et al. | 361/783 |
| 6,229,727 B1 | 5/2001 | Doyle | 365/63 |
| 6,233,376 B1 | 5/2001 | Updegrove | 385/14 |
| 6,243,769 B1 | 6/2001 | Rooney | 710/56 |
| 6,243,831 B1 | 6/2001 | Mustafa et al. | 714/24 |
| 6,246,618 B1 | 6/2001 | Yamamoto et al. | 365/200 |
| 6,247,107 B1 | 6/2001 | Christie | 711/216 |
| 6,249,802 B1 | 6/2001 | Richardson et al. | 709/200 |
| 6,256,253 B1 | 7/2001 | Oberlaender et al. | 365/230.02 |
| 6,256,692 B1 | 7/2001 | Yoda et al. | 710/104 |
| 6,266,730 B1 | 7/2001 | Perino et al. | 710/126 |
| 6,272,609 B1 | 8/2001 | Jeddeloh | 711/169 |
| 6,285,349 B1 | 9/2001 | Smith | 345/147 |
| 6,286,083 B1 | 9/2001 | Chin et al. | 711/151 |
| 6,294,937 B1 | 9/2001 | Crafts et al. | 327/158 |
| 6,301,637 B1 | 10/2001 | Krull et al. | 711/112 |
| 6,327,642 B1 | 12/2001 | Lee et al. | 711/120 |
| 6,330,205 B2 | 12/2001 | Shimizu et al. | 365/230.06 |
| 6,343,171 B1 | 1/2002 | Yoshimura et al. | 385/50 |
| 6,344,664 B1 | 2/2002 | Trezza et al. | 257/82 |
| 6,347,055 B1 | 2/2002 | Motomura | 365/189.05 |
| 6,349,363 B2 | 2/2002 | Cai et al. | 711/129 |
| 6,356,573 B1 | 3/2002 | Jonsson et al. | 372/46 |
| 6,366,375 B1 | 4/2002 | Sakai et al. | 359/115 |
| 6,366,529 B1 | 4/2002 | Williams et al. | 365/239 |
| 6,367,074 B1 | 4/2002 | Bates et al. | 717/11 |
| 6,370,068 B2 | 4/2002 | Rhee | 365/196 |
| 6,370,611 B1 | 4/2002 | Callison et al. | 711/105 |
| 6,373,777 B1 | 4/2002 | Suzuki | 365/230.03 |
| 6,381,190 B1 | 4/2002 | Shinkai | 365/230.03 |
| 6,389,514 B1 | 5/2002 | Rokicki | 711/136 |

| Patent | Kind | Date | Inventor | Class |
|---|---|---|---|---|
| 6,392,653 | B1 | 5/2002 | Malandain et al. | 345/501 |
| 6,401,149 | B1 | 6/2002 | Dennin et al. | 710/58 |
| 6,401,213 | B1 | 6/2002 | Jeddeloh | 713/401 |
| 6,405,273 | B1 | 6/2002 | Fleck et al. | 710/310 |
| 6,405,280 | B1 | 6/2002 | Ryan | 711/105 |
| 6,421,744 | B1 | 7/2002 | Morrison et al. | 710/22 |
| 6,430,696 | B1 | 8/2002 | Keeth | 713/503 |
| 6,433,785 | B1 | 8/2002 | Garcia et al. | 345/531 |
| 6,434,639 | B1 | 8/2002 | Haghighi | 710/39 |
| 6,434,654 | B1 | 8/2002 | Story et al. | 710/307 |
| 6,434,696 | B1 | 8/2002 | Kang | 713/2 |
| 6,434,736 | B1 | 8/2002 | Schaecher et al. | 716/17 |
| 6,438,622 | B1 | 8/2002 | Haghighi et al. | 710/1 |
| 6,438,668 | B1 | 8/2002 | Esfahani et al. | 711/165 |
| 6,449,308 | B1 | 9/2002 | Knight, Jr. et al. | 375/212 |
| 6,453,377 | B1 | 9/2002 | Farnworth et al. | 710/300 |
| 6,453,393 | B1 | 9/2002 | Holman et al. | 711/154 |
| 6,457,116 | B1 | 9/2002 | Mirsky et al. | 712/16 |
| 6,460,114 | B1 | 10/2002 | Jeddeloh | 711/120 |
| 6,462,978 | B2 | 10/2002 | Shibata et al. | 365/63 |
| 6,463,059 | B1 | 10/2002 | Movshovich et al. | 370/389 |
| 6,470,422 | B2 | 10/2002 | Cai et al. | 711/129 |
| 6,473,828 | B1 | 10/2002 | Matsui | 711/104 |
| 6,477,592 | B1 | 11/2002 | Chen et al. | 710/52 |
| 6,477,614 | B1 * | 11/2002 | Leddige et al. | 711/5 |
| 6,477,621 | B1 | 11/2002 | Lee et al. | 711/120 |
| 6,479,322 | B2 | 11/2002 | Kawata et al. | 438/109 |
| 6,490,188 | B2 | 12/2002 | Nuxoll et al. | 365/63 |
| 6,493,784 | B1 | 12/2002 | Kamimura et al. | 710/309 |
| 6,493,803 | B1 | 12/2002 | Pham et al. | 711/147 |
| 6,496,193 | B1 | 12/2002 | Surti et al. | 345/552 |
| 6,496,909 | B1 | 12/2002 | Schimmel | 711/163 |
| 6,501,471 | B1 | 12/2002 | Venkataraman et al. | 345/424 |
| 6,502,161 | B1 | 12/2002 | Perego et al. | 711/5 |
| 6,505,287 | B2 | 1/2003 | Uematsu | 711/170 |
| 6,507,899 | B1 | 1/2003 | Oberlaender et al. | 711/169 |
| 6,523,092 | B1 | 2/2003 | Fanning | 711/134 |
| 6,523,093 | B1 | 2/2003 | Bogin et al. | 711/137 |
| 6,526,483 | B1 | 2/2003 | Cho et al. | 711/154 |
| 6,526,498 | B1 | 2/2003 | Mirsky et al. | 712/11 |
| 6,539,490 | B1 | 3/2003 | Forbes et al. | 713/401 |
| 6,552,304 | B1 | 4/2003 | Hirose et al. | 219/216 |
| 6,552,564 | B1 | 4/2003 | Forbes et al. | 326/30 |
| 6,553,479 | B2 | 4/2003 | Mirsky et al. | 712/16 |
| 6,564,329 | B1 | 5/2003 | Cheung et al. | 713/322 |
| 6,567,963 | B1 | 5/2003 | Trezza | 716/8 |
| 6,570,429 | B1 * | 5/2003 | Hellriegel | 327/295 |
| 6,584,543 | B2 | 6/2003 | Williams et al. | 711/105 |
| 6,587,912 | B2 | 7/2003 | Leddige et al. | 711/5 |
| 6,590,816 | B2 | 7/2003 | Perner | 365/200 |
| 6,594,713 | B1 | 7/2003 | Fuoco et al. | 710/31 |
| 6,594,722 | B1 | 7/2003 | Willke, II et al. | 710/313 |
| 6,598,154 | B1 | 7/2003 | Vaid et al. | 712/237 |
| 6,599,031 | B2 | 7/2003 | Li | 385/88 |
| 6,615,325 | B2 | 9/2003 | Mailloux et al. | 711/154 |
| 6,622,227 | B2 | 9/2003 | Zumkehr et al. | 711/167 |
| 6,623,177 | B1 | 9/2003 | Chilton | 385/88 |
| 6,628,294 | B1 | 9/2003 | Sadowsky et al. | 345/568 |
| 6,629,220 | B1 | 9/2003 | Dyer | 711/158 |
| 6,631,440 | B2 | 10/2003 | Jenne et al. | 711/105 |
| 6,636,110 | B1 | 10/2003 | Ooishi et al. | 327/565 |
| 6,636,957 | B2 | 10/2003 | Stevens et al. | 711/171 |
| 6,643,787 | B1 | 11/2003 | Zerbe et al. | 713/400 |
| 6,646,929 | B1 | 11/2003 | Moss et al. | 365/194 |
| 6,647,470 | B1 | 11/2003 | Janzen | 711/154 |
| 6,651,139 | B1 | 11/2003 | Ozeki et al. | 711/118 |
| 6,658,509 | B1 | 12/2003 | Bonella et al. | 710/100 |
| 6,661,940 | B2 | 12/2003 | Kim | 385/15 |
| 6,661,943 | B2 | 12/2003 | Li | 385/18 |
| 6,662,304 | B2 | 12/2003 | Keeth et al. | 713/400 |
| 6,665,202 | B2 | 12/2003 | Lindahl et al. | 365/49 |
| 6,667,895 | B2 | 12/2003 | Jang et al. | 365/63 |
| 6,681,292 | B2 | 1/2004 | Creta et al. | 711/119 |
| 6,681,301 | B1 | 1/2004 | Mehta et al. | 711/154 |
| 6,697,926 | B2 | 2/2004 | Johnson et al. | 711/167 |
| 6,707,726 | B2 | 3/2004 | Nishio et al. | 365/189.12 |
| 6,711,652 | B2 | 3/2004 | Arimilli et al. | 711/141 |
| 6,715,018 | B2 | 3/2004 | Farnworth et al. | 710/300 |
| 6,718,440 | B2 | 4/2004 | Maiyuran et al. | 711/137 |
| 6,721,187 | B2 | 4/2004 | Hall et al. | 361/760 |
| 6,721,195 | B2 | 4/2004 | Brunelle et al. | 365/63 |
| 6,724,685 | B2 | 4/2004 | Braun et al. | 365/233 |
| 6,728,800 | B1 | 4/2004 | Lee et al. | 710/54 |
| 6,735,679 | B1 | 5/2004 | Herbst et al. | 711/167 |
| 6,735,682 | B2 | 5/2004 | Segelken et al. | 711/220 |
| 6,745,275 | B2 | 6/2004 | Chang | 710/305 |
| 6,751,113 | B2 | 6/2004 | Bhakta et al. | 365/63 |
| 6,751,703 | B2 | 6/2004 | Chilton | 711/113 |
| 6,751,722 | B2 | 6/2004 | Mirsky et al. | 712/15 |
| 6,752,539 | B2 | 6/2004 | Colgan et al. | 385/92 |
| 6,754,117 | B2 | 6/2004 | Jeddeloh | 365/201 |
| 6,754,812 | B1 | 6/2004 | Abdallah et al. | 712/234 |
| 6,756,661 | B2 | 6/2004 | Tsuneda et al. | 257/673 |
| 6,760,833 | B1 | 7/2004 | Dowling | 712/34 |
| 6,771,538 | B2 | 8/2004 | Shukuri et al. | 365/185.05 |
| 6,772,261 | B1 | 8/2004 | D'Antonio et al. | 710/301 |
| 6,775,747 | B2 | 8/2004 | Venkatraman | 711/137 |
| 6,785,780 | B1 | 8/2004 | Klein et al. | 711/148 |
| 6,789,173 | B1 | 9/2004 | Tanaka et al. | 711/147 |
| 6,792,059 | B2 | 9/2004 | Yuan et al. | 375/354 |
| 6,792,496 | B2 | 9/2004 | Aboulenein et al. | 710/306 |
| 6,793,408 | B2 | 9/2004 | Levy et al. | 385/88 |
| 6,793,411 | B2 | 9/2004 | Seifert | 385/92 |
| 6,795,899 | B2 | 9/2004 | Dodd et al. | 711/137 |
| 6,799,246 | B1 | 9/2004 | Wise et al. | 711/117 |
| 6,799,268 | B1 | 9/2004 | Boggs et al. | 712/228 |
| 6,804,760 | B2 | 10/2004 | Wiliams | 711/170 |
| 6,804,764 | B2 | 10/2004 | LaBerge et al. | 711/170 |
| 6,807,630 | B2 | 10/2004 | Lay et al. | 713/2 |
| 6,811,320 | B1 | 11/2004 | Abbott | 385/58 |
| 6,816,931 | B2 | 11/2004 | Shih | 710/62 |
| 6,816,947 | B1 | 11/2004 | Huffman | 711/151 |
| 6,820,181 | B2 | 11/2004 | Jeddeloh et al. | 711/169 |
| 6,821,029 | B1 | 11/2004 | Grung et al. | 385/92 |
| 6,823,023 | B1 | 11/2004 | Hannah | 375/296 |
| 6,826,160 | B1 | 11/2004 | Wang et al. | 370/329 |
| 6,829,398 | B2 | 12/2004 | Ouchi | 385/14 |
| 6,845,409 | B1 | 1/2005 | Talagala et al. | 710/20 |
| 6,889,304 | B2 | 5/2005 | Perego et al. | 711/170 |
| 6,904,556 | B2 | 6/2005 | Walton et al. | 714/766 |
| 6,910,109 | B2 | 6/2005 | Holman et al. | 711/156 |
| 6,910,812 | B2 | 6/2005 | Pommer et al. | 385/92 |
| 6,947,672 | B2 | 9/2005 | Jiang et al. | 398/135 |
| 6,949,406 | B2 | 9/2005 | Bosnyak et al. | 438/106 |
| 6,950,956 | B2 | 9/2005 | Zerbe et al. | 713/400 |
| 6,956,996 | B2 | 10/2005 | Gordon et al. | 385/48 |
| 6,961,259 | B2 | 11/2005 | Lee et al. | 365/63 |
| 6,961,834 | B2 | 11/2005 | Weber | 711/169 |
| 6,980,748 | B2 | 12/2005 | Leas | 398/202 |
| 6,982,892 | B2 | 1/2006 | Lee et al. | 365/63 |
| 7,000,062 | B2 | 2/2006 | Perego et al. | 711/5 |
| 7,016,213 | B2 | 3/2006 | Reeves et al. | 365/63 |
| 7,016,606 | B2 | 3/2006 | Cai et al. | 398/27 |
| 7,024,547 | B2 | 4/2006 | Kartoz | 713/1 |
| 7,035,212 | B1 | 4/2006 | Mittal et al. | 370/230 |
| 7,047,351 | B2 | 5/2006 | Jeddeloh | 711/5 |
| 7,062,595 | B2 | 6/2006 | Lindsay et al. | 710/315 |
| 7,102,907 | B2 | 9/2006 | Lee et al. | 365/63 |
| 7,106,611 | B2 | 9/2006 | Lee et al. | 365/200 |
| 7,106,973 | B2 | 9/2006 | Kube et al. | 398/164 |
| 7,120,727 | B2 | 10/2006 | Lee et al. | 711/5 |
| 7,136,953 | B1 | 11/2006 | Bisson et al. | 710/307 |
| 7,171,508 | B2 | 1/2007 | Choi | 710/307 |
| 2001/0023474 | A1 | 9/2001 | Kyozuka et al. | 711/114 |
| 2001/0034839 | A1 | 10/2001 | Karjoth et al. | 713/190 |
| 2001/0039612 | A1 | 11/2001 | Lee | 713/2 |

| | | | | | | | |
|---|---|---|---|---|---|---|---|
| 2002/0038412 | A1 | 3/2002 | Nizar et al. ............... 711/170 | 2006/0023528 | A1 | 2/2006 | Pax et al. .................. 365/202 |
| 2002/0112119 | A1 | 8/2002 | Halbert et al. ............. 711/115 | 2006/0047891 | A1 | 3/2006 | James et al. ............... 711/105 |
| 2002/0116588 | A1 | 8/2002 | Beckert et al. ............. 711/161 | 2006/0179203 | A1 | 8/2006 | Jeddeloh ................... 710/311 |
| 2002/0144064 | A1 | 10/2002 | Fanning ..................... 711/144 | 2006/0179208 | A1 | 8/2006 | Jeddeloh ................... 711/100 |
| 2002/0178319 | A1 | 11/2002 | Sanchez-Olea ............ 710/305 | 2006/0195647 | A1 | 8/2006 | Jeddeloh ................... 711/100 |
| 2003/0005223 | A1 | 1/2003 | Coulson et al. ............ 711/118 | 2006/0200598 | A1 | 9/2006 | Janzen ....................... 710/58 |
| 2003/0043158 | A1 | 3/2003 | Wasserman et al. ........ 345/545 | 2006/0204247 | A1 | 9/2006 | Murphy ..................... 398/139 |
| 2003/0043426 | A1 | 3/2003 | Baker et al. ................ 359/109 | 2006/0206742 | A1 | 9/2006 | James ........................ 713/503 |
| 2003/0065836 | A1 | 4/2003 | Pecone ....................... 710/62 | 2006/0218331 | A1 | 9/2006 | James ........................ 710/305 |
| 2003/0093630 | A1 | 5/2003 | Richard et al. ............. 711/154 | | | | |
| 2003/0095559 | A1 | 5/2003 | Sano et al. ................. 370/419 | | | | |
| 2003/0149809 | A1 | 8/2003 | Jensen et al. ............... 710/22 | | | | |
| 2003/0163649 | A1 | 8/2003 | Kapur et al. ............... 711/146 | | | | |
| 2003/0177320 | A1 | 9/2003 | Sah et al. ................... 711/158 | | | | |
| 2003/0193927 | A1 | 10/2003 | Hronik ....................... 370/351 | | | | |
| 2003/0217223 | A1 | 11/2003 | Nino, Jr. et al. ............ 711/105 | | | | |
| 2003/0227798 | A1 | 12/2003 | Pax ........................ 365/189.12 | | | | |
| 2003/0229734 | A1 | 12/2003 | Chang et al. ............... 710/36 | | | | |
| 2003/0229762 | A1 | 12/2003 | Maiyuran et al. .......... 711/137 | | | | |
| 2003/0229770 | A1 | 12/2003 | Jeddeloh .................... 711/213 | | | | |
| 2004/0015650 | A1 | 1/2004 | Zumkehr et al. ........... 711/105 | | | | |
| 2004/0022094 | A1 | 2/2004 | Radhakrishnan et al. .... 365/200 | | | | |
| 2004/0024959 | A1 | 2/2004 | Taylor ........................ 711/105 | | | | |
| 2004/0028412 | A1 | 2/2004 | Murphy ..................... 398/135 | | | | |
| 2004/0064602 | A1 | 4/2004 | George ....................... 710/22 | | | | |
| 2004/0123088 | A1 | 6/2004 | Poisner et al. .............. 713/1 | | | | |
| 2004/0126115 | A1 | 7/2004 | Levy et al. ................. 398/116 | | | | |
| 2004/0128421 | A1 | 7/2004 | Forbes ........................ 710/303 | | | | |
| 2004/0128449 | A1 | 7/2004 | Osborne et al. ............ 711/137 | | | | |
| 2004/0144994 | A1 | 7/2004 | Lee et al. .................... 257/200 | | | | |
| 2004/0148482 | A1 | 7/2004 | Grundy et al. ............. 711/167 | | | | |
| 2004/0230718 | A1 | 11/2004 | Polzin et al. ................ 710/22 | | | | |
| 2004/0236885 | A1 | 11/2004 | Fredriksson et al. ........ 710/100 | | | | |
| 2004/0251929 | A1 | 12/2004 | Pax et al. .................... 326/30 | | | | |
| 2004/0268009 | A1 | 12/2004 | Shin et al. ................... 710/310 | | | | |
| 2005/0030797 | A1 | 2/2005 | Pax et al. ................ 365/189.12 | | | | |
| 2005/0044304 | A1 | 2/2005 | James ........................ 711/105 | | | | |
| 2005/0044327 | A1 | 2/2005 | Howard et al. ............. 711/147 | | | | |
| 2005/0071542 | A1 | 3/2005 | Weber et al. ............... 711/105 | | | | |
| 2005/0091464 | A1 | 4/2005 | James ........................ 711/167 | | | | |
| 2005/0105350 | A1 | 5/2005 | Zimmerman ............... 365/201 | | | | |
| 2005/0146946 | A1 | 7/2005 | Taylor .................... 365/189.05 | | | | |
| 2005/0162882 | A1 | 7/2005 | Reeves et al. .............. 365/63 | | | | |
| 2005/0166006 | A1 | 7/2005 | Talbot et al. ............... 711/105 | | | | |
| 2005/0177690 | A1 | 8/2005 | LaBerge ..................... 711/154 | | | | |
| 2005/0210216 | A1 | 9/2005 | Jobs et al. ................... 711/170 | | | | |
| 2005/0216648 | A1 | 9/2005 | Jeddeloh .................... 710/311 | | | | |
| 2005/0228939 | A1 | 10/2005 | Janzen ....................... 711/105 | | | | |
| 2005/0257021 | A1 | 11/2005 | James ........................ 711/170 | | | | |
| 2005/0268060 | A1 | 12/2005 | Cronin et al. ............... 711/167 | | | | |

FOREIGN PATENT DOCUMENTS

| | | |
|---|---|---|
| GB | 2288066 | 4/1995 |
| JP | 2001265539 A | 9/2001 |
| WO | WO 93/19422 | 9/1993 |
| WO | WO 98/57489 | 12/1998 |
| WO | WO 02/27499 A2 | 4/2002 |

OTHER PUBLICATIONS

"Free On-Line Dictionary of Computing" entry Flash Erasable Programmable Read-Only Memory, online May 17, 2004 [http://foldoc.doc.ic.ac.uk/foldoc/foldoc.cgi?flash+memory].

Gillett, R. et al., "Using The Memory Channel Network", Micro IEEE, vol. 17, Issue 1, Jan.-Feb. 1997 (Abstract Only).

Gommans et al., *"Applications Drive Secure Lightpath Creation Across Heterogeneous Domains"*, Communications Magazine, IEEE, vol. 44, Issue 3, Mar. 2006 (Abstract Only).

Hsieh, Ming-Chia et al., "On the design of a local switch for heterogenous multi-subsystem interconnect", Oct. 1993 (Abstract Only).

Intel, "Flash Memory PCI Add-In Card for Embedded Systems", Application Note AP-758, Sep. 1997, pp. i-13.

Intel, "Intel 840 Chipset: 82840 Memory Controller Hub (MCH)", Datasheet, www.intel.com/design/chipsets/datashts/298020.htm, Oct. 1999, pp. 1-178.

Micron Technology, Inc., "Synchronous DRAM Module 512MB/1GB (x72, ECC) 168-PIN Registered FBGA SDRAM DIMM", Micron Technology, Inc., 2002, pp. 1-23.

Shanley, T. et al., "PCI System Architecture", Third Edition, Mindshare, Inc., 1995, pp. 24-25.

"Neural network controller for minimizing hub shear forces in helicopter" by Omkar et al. (abstract only) Publication Date: Sep. 14-17, 1998.

Gillingham, Peter, SLDRAM Architectural and Functional Overview, 1997 SLDRAM Consortium, Aug. 29, 1997, p. 14.

Clugston, Mike, "Definition of 'cache'," 2004, CREDO reference, formerly Xreferplus, www.xreferplus.com.

Andrew Tanenbaum, "Structured Computer Organization", 1990, Third Edition, pp. 11-13.

* cited by examiner

SYSTEM AND METHOD FOR OPTIMIZING INTERCONNECTIONS OF MEMORY DEVICES IN A MULTICHIP MODULE

CROSS-REFERENCE TO RELATED APPLICATION

This application is a continuation of pending U.S. patent application Ser. No. 10/232,842, filed Aug. 29, 2002.

TECHNICAL FIELD

This invention relates generally to computer memory devices. More specifically, the present invention relates to methods and apparatus for eliminating skew between a plurality of memory devices conductively coupled to a memory hub, and allowing for improved signal integrity between the hub and the memory devices.

BACKGROUND OF THE INVENTION

A main focus of the contemporary semiconductor industry is the creation of smaller and more efficient memory modules. These efforts are often frustrated by cross talk and skew. Cross talk is an inductive effect which can arise when a variable current flows through a conductor. Variable current creates a corresponding variable magnetic field surrounding the conductor capable of inducing a disruptive signal in any adjacent conductors passing through the magnetic field. As a consequence, the placement of conductors in a memory module must be carefully engineered in order to maintain suitable distances of separation between conductors to minimize the effects of cross talk.

Skew is differential delay between two signals forced to travel different path lengths. One technique to eliminate skew is to make the path lengths along which signals are coupled the same length. In this way, signal travel time will be the same, thus eliminating any differential delay. Overall, the necessity of such careful considerations in both distancing conductors from each other and in creating equivalent path lengths to minimize the effects of cross talk and skew complicates efforts to create effective memory modules with small dimensions.

Figure 1:
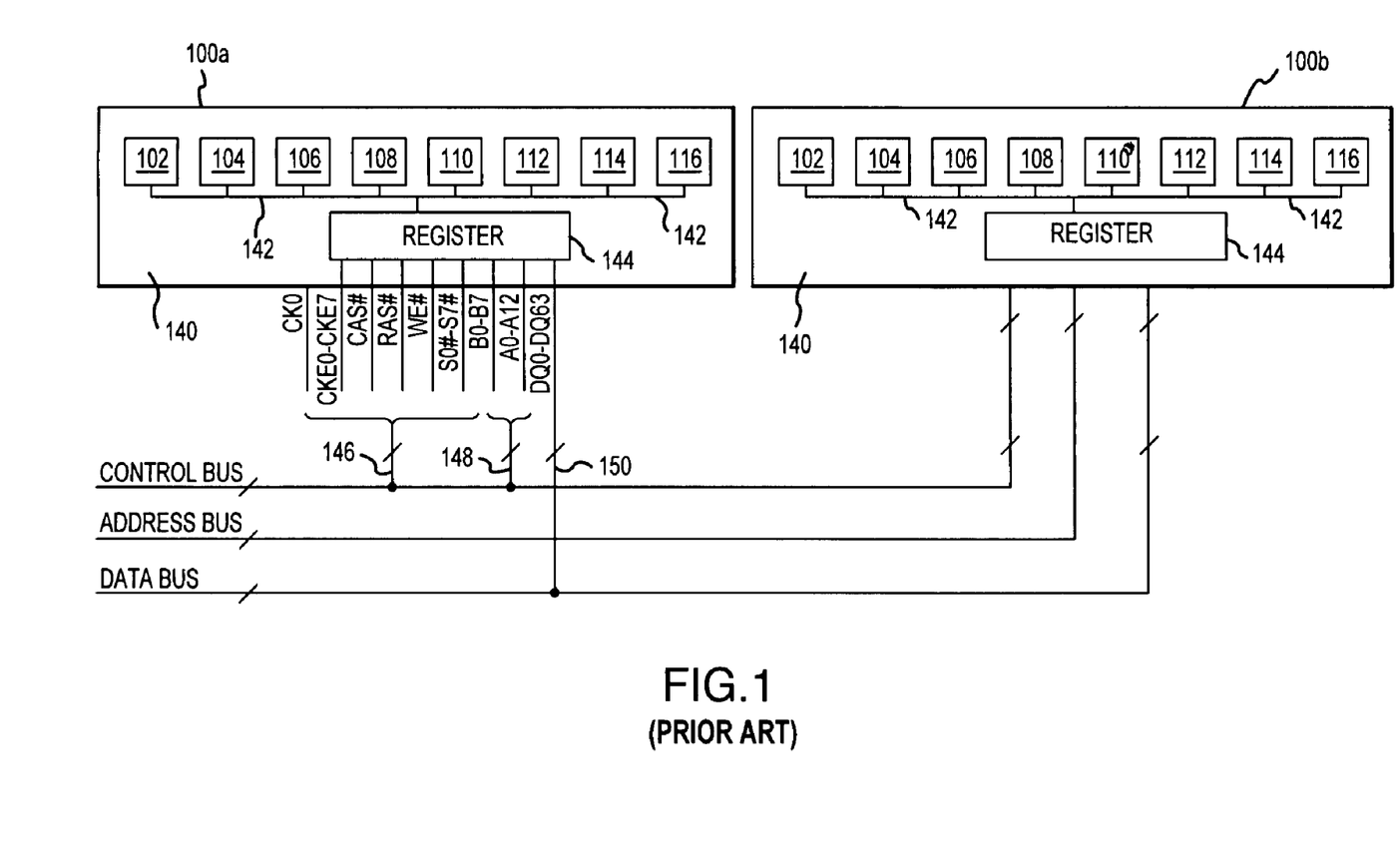
FIG. 1 is a block diagram of a portion of a conventional computer system containing a plurality of conventional registered DRAM modules.

Generally, memory modules are comprised of individual memory devices coupled in parallel on a circuit board. These memory devices can be dynamic random access memory ("DRAM") devices suitable for a wide variety of applications. A partial top plan view of one type of memory module known in the art is shown in FIG. 1. As illustrated, two registered double in-line memory modules (DIMM) 100a, 100b include a plurality of memory devices 102-116 arranged on a circuit board 140 and connected by a command/address bus 142 to a register 144. The memory devices 102-116 and the conductors of the command/address bus 142 are situated on the circuit board 140 with enough space between them to minimize any cross talk. The register 144 receives command signals applied through a control bus 146 and address signals applied through an address bus 148 from an external memory controller (not shown).

As illustrated in the registered memory module 100 shown in FIG. 1, the command signals applied to the register 144 include a row address strobe signal ("RAS#") (the "#" indicates the signal is active low), a column address strobe signal ("CAS#"), clock enable signals ("CKE0" and "CKE7"), a write enable signal ("WE#") and chip select signals ("S0#"-"S7#") to activate the DRAM devices 102-116, respectively. Other signals not latched by the register 144 include a clock ("CK0") signal, data signals ("DQ0-DQ63") corresponding to an 64-bit data word applied to the modules through a data bus 150, and a number of other signals that are not pertinent to the present discussion. In this registered DRAM module, bank address signals ("B0-B7") corresponding to an 8-bit bank address and row/column address signals ("A0-A12") corresponding to a 13-bit address are also applied to the register 144 through the address bus 148.

In operation, when a computer processor reads data from, or writes data to, a specific memory address in a particular memory device 102-116, it sends a signal to the memory controller (not shown) over a host bus (also not shown). The request is analyzed by the memory controller, which applies corresponding address signals A0-A12 and the previously described command signals to the registered DIMMs 100a-b. These signals are latched into the registers 144 of both of these modules 100a-b, with each module 100a-b receiving a different pair of chip select signals designating which of the modules 100a-b is to be accessed. However, only one of the memory modules 100a-b is selected for a memory access or for a memory writing by switching its device select signals S0# and S1# active low. An appropriate command signal is then applied to the command/address bus 142 by the register 144 to all of the memory devices 102-116 in the module 100.

During write operations, the command signal includes address signals and command signals enabling the memory controller to access and write to appropriate memory cells in each of the memory devices 102-116. Data bits DQ0-DQ63 from the data bus 150 are then applied over an internal data path (not shown for the sake of clarity) to the memory cells in each of the memory devices 102-116. The internal data path consists of individual traces running from the memory devices 102-116 to signal traces (not shown) on an edge of the circuit board 140. During write operations the register 144 also operates to generate the appropriate command and timing signals to control the memory devices 102-116.

During read operations, the command signal includes address signals and command signals enabling the memory controller to access and read appropriate memory cells in each of the memory devices 102-116. The read data stored in the addressed memory cells are then applied over the internal data path to the data bus 150 and the memory controller as read data bits DQ0-DQ64.

As can be seen in FIG. 1, the off-module command and address signals are applied to the midpoint of the module 100 such that the length of the control bus 146 and the address bus 148 on the module 100 is short. However, since the memory devices 102-116 are disposed on either side of the register 144, the path lengths of the command/address bus 142 to the memory devices 102-116 are of different lengths. As a result, address and command signals coupled from the register 144 to the different memory devices 102-116 are susceptible to skew. For example, the difference in delay in coupling command and address signals from the register 144 to the memory devices 102 and 108 makes it difficult to capture the command and address signals at both memory devices with a common clock signal. This potential for signal skew can seriously limit the operating speed of the memory devices 102-116.

One way to solve this problem is to increase the path lengths of the command/address bus 142 coupled to the devices 104-114 to make them equal to the path length of the command/address bus 142 to the devices 102 and 116. While such a solution is effective in ameliorating skew, it requires the placement of a greater length of conductive lines on the module 100. This consumes more space, increases propagation delay, and may adversely affect signal integrity.

Further, as memory bus speeds continue to increase, a need will arise to buffer data signals, i.e. a data buffer device or devices will be included to perform a similar function for data signals as the register device does for command and address signals. The data buffer function may reside in one or more devices, which may or may not be integrated with the command address register. Seen in this light, modules based on a memory hub having data buffers aligned in the same general layout as shown for the memory devices in FIG. 1 would encounter the same problems for data signals as were described above for command and address signals.

What is needed is a memory module that minimizes skew and maximizes signal integrity between the hub and memory devices as well as between the controller and the module.

SUMMARY OF THE INVENTION

The present invention is directed to a memory module and method for coupling a memory module to a memory controller in a computer. A memory hub on the module is operable to receive memory signals from a high speed memory link and apply memory signals on the high speed memory link. The memory hub is further operable to translate between memory signals and electrical command, address and data signals. These electrical signals are communicated between the memory hub and a plurality of memory devices over conductors of equal length. The memory hub is preferably positioned at the center of the memory module and the memory devices positioned around the memory hub to facilitate a direct electrical connection between the hub and the memory devices.

DETAILED DESCRIPTION OF THE INVENTION

Figure 2:
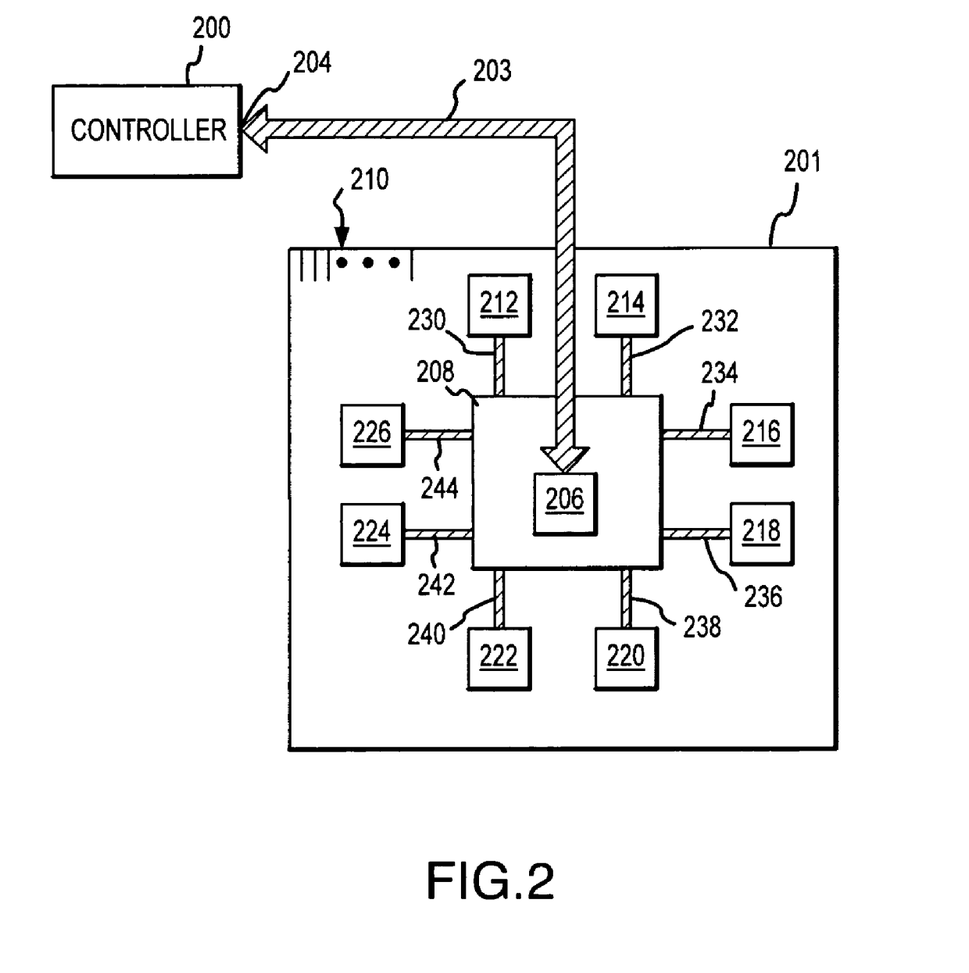
FIG. 2 is a block diagram of a portion of a computer system including a controller and a memory module according to one embodiment of the invention.

FIG. 2 is a block diagram of a portion of a computer system according to one embodiment of the invention. A controller 200, such as a system controller or a memory controller, is coupled to a memory module 201 through a high speed memory link 203, although a greater number of modules 201 may be coupled to the controller 200. The controller 200 and the memory module 201 are coupled to the high speed memory link 203 through an interface 204 on the controller 200 and an interface 206 in a memory hub 208 on the module 201, respectively.

The high speed memory link 203 may be configured to carry electrical or optical signals. For example, when an electrical coupling is desired, the high speed memory link 203 may include separate control, address and data buses operable to carry corresponding command, address and data signals between the controller 200 and the module 201. Command signals can include clock signals, masking signals, and various other control signals. Alternately, the high speed memory link 203 may include a greater or lesser number of buses. For example, a single bus may be used to couple one or more packets containing electrical command, address and data bits between the controller 200 and the memory module 201.

When an optical link is desired, the high speed memory link 203 may be configured to enable the controller 200 to communicate with the memory module 201 in any of a variety of communications protocols, but communication using optical signal packets containing data, address and command information is preferred. The high speed memory link 203 may be one or more optical fibers, free space, or some other optical coupling medium that allows light to be transmitted between the controller 200 and the memory module 201.

Additionally, although the high speed memory link 203 may include a single communication link through which command, address and data signals are coupled, it preferably includes several communication links operating in conjunction with each other. For example, a first communication link may be used to couple the data signals between the controller 200 and the memory module 201, and a second communication link may be used to couple command and address signals from the controller 200 to the memory module 201. Moreover, the high speed memory link 203 may be one or more point-to-point links coupling the controller 200 to the memory module 201. Alternately, the high speed memory link 203 may include a mixture of point-to-point links and busses coupling the controller 200 to the memory module 201. Point-to-point links, as discussed herein, should be understood to include high speed connections, conventional wire connections, and other connections known in the art. The high speed memory link 203 may also include a plurality of unidirectional high speed links coupling the controller 200 to the memory module 201. For example, one unidirectional high speed link could carry all signals directed from the controller 200 to the memory module 201, while another unidirectional high speed link could carry all signals from the memory module 201 to the controller 200. As discussed above, each of the unidirectional high speed links could include busses, point-point links or a combination of the two coupling the controller 200 to the memory module 201. In either case, the command, data and address signals are preferably coupled through a conventional communication protocol, such as by sending data packets, time-division multiplexing, etc. Still referring to FIG. 2, the interface 206 in the memory hub 208 receives signals from the high speed data link 203 and develops them into corresponding address, data and command signals to be applied to memory devices 212-226 on the module 201. The memory devices 212-226 on the module 201 may be, for example, synchronous random access memories ("SDRAMs"), and a number greater or less than the eight devices shown in FIG. 2 may be coupled to the memory hub 208. Moreover, it will also be understood that the term "memory device" as used herein can be read to refer to a device operable to buffer data signals, i.e. to perform a similar function for data signals as the register device, as mentioned in the discussion of FIG. 1 above, does for command and address signals.

When the signals applied to the high speed data link 203 are electrical, they are received in the interface 206 of the memory hub 208 and converted into corresponding electrical command, address and data signals suitable for application to the memory devices 212-226 through bus system 230-244. Application of the command, address and data signals to the memory devices 212-226 is done at individual ports (not shown for the sake of clarity) on the memory hub 208 to which the individual busses in the bus system 230-244 are coupled. Accordingly, the memory hub 208 in such a configuration is also operable to receive electrical signals from the memory devices 212-226 and convert the electrical signals into corresponding signals suitable for application to the high speed data link 203.

When the signals applied to the high speed memory link 203 are optical, they must be received in the interface 206. The interface 206 can receive light at any of a plurality of wavelengths λ, and it converts the received light into corresponding electrical command, address and data signals and applies these signals to the memory devices 212-226 over the memory hub 208 and bus system 230-244. The interface 206 also receives electrical signals originating in the memory devices 212-226 which are applied to the bus system 230-244 and received in the memory hub 208. The signals are subsequently coupled from the memory hub 208 to the interface 206 which converts the electrical signals into corresponding optical signals, preferably at any of a plurality of wavelengths λ. These optical signals are coupled to the controller 200 through the high speed memory link 203.

The bus system 230-244 coupling the memory devices 216-226 to the memory module 201 may include, for example, separate command, address and data buses, although it may alternatively include a greater or lesser number of buses running from each memory device 212-226 to the memory hub. For example, a single bus may be used to couple one or more packets containing command, address and data bits between the memory hub 208 and a corresponding memory device 212-226.

Still referring to FIG. 2, the memory hub 208 is placed in the interior of the module 201 such that the individual memory devices 212-226 may be placed along a perimeter of the memory hub 208. In a preferred embodiment, the memory hub 208 is placed at the center of the module 201. Placing the memory hub 208 at the center of the module 201 makes it easier for each individual bus in the bus system 230-244 coupling each memory device 212-226 to the memory hub 208 to be substantially the same length. As a result, travel times for electrical command, address and data signals between each memory device 212-226 and the memory hub 208 are the same regardless of which memory device 212-226 is in communication with the hub 208. Consequently, signals traveling to and from the hub 208 to different memory devices 212-226 do not experience differential delay, and thus skew is eliminated. Additionally, because the memory devices 212-226 are placed along the perimeter of the memory hub 208 the individual busses in the bus system 230-244 can be coupled directly to the memory hub 208 over the shortest path possible between each memory device 212-226 and the memory hub 208. This minimizes path lengths between the memory devices 212-226 and the memory hub, which decreases signal travel times. This also minimizes bus lengths, which minimizes the space on the module 201 required by the bus system 230-244. Moreover, placing the memory hub 208 in the interior of the module 201 is important in that it allows for a greater spacing of the memory devices 212-226 from each other, thus decreasing the potential for cross talk.

In FIG. 2, the memory hub 208 is shown as being substantially rectangular. It should be understood that other geometric shapes, for example circles and triangles, may also be effectively used. In addition, it should be understood that the functioning of the module 208 may also vary. For example, in one aspect, the memory hub 208 receives a signal from the controller 200 over the high speed memory link 203 and converts it into electrical command, address and data signals as discussed above. These signals are subsequently applied simultaneously to all of the individual busses in the bus system 230-244, and because of the equivalent path lengths of the individual busses, are simultaneously received by the individual memory devices 212-226. The memory devices 212-226 then analyze the received command signal for a respective chip select signal encoded within. Each of the memory devices 212-226 has a unique chip select signal enabling the memory hub 208 to access the appropriate memory device 212-226 by including its corresponding unique chip select signal in the command signal sent to all of the memory devices 212-226. The other memory devices 212-226 whose unique chip select signal is not included in the command signal are not enabled, and thus do not react to the command, address and data signals coupled to them by the memory hub 208. Of course, if desired, the command signal may include several chip select signals, allowing a plurality of memory devices 212-226 to act on the same electrical command, address and data signals applied by the memory hub 208 to the bus system 230-244.

During a read operation, the enabled device analyzes control information contained in the command signal as well as address information contained in the address signal to enable the device to access and read appropriate memory cells within itself The read data stored in the addressed memory cells is then applied over the individual bus in the bus system 230-244 coupling the enabled memory device 212-226 to the memory hub 208. Once received in the memory hub 208, the data signal is converted into a signal suitable to be applied to the high speed memory link 203, and the signal is transmitted to the controller 200 as discussed above.

During a write operation, command, address and data signals are applied to the bus system 230-244 as in the read cycle, with the appropriate memory device, or devices, being enabled by chip select signals contained within the command signal. In the write operation however, the command signal includes an additional write enable signal enabling a selected memory device 212-236 to accept data contained in the data signal and write it to an appropriate memory cell indicated by address information contained in the address signal.

In another aspect, the memory hub 208 may include a multiplexing function. After receiving a memory request from the controller 200 over the high speed memory link 203 and converting it into electrical command, address and data signals as discussed above, the memory hub subsequently examines the electrical command signals for information indicating which memory device 212-226 is to be accessed. Once this information is found and decoded, the memory hub 208 applies the electrical command, address and data signals to the individual bus in the bus system 230-244 that couples the appropriate memory device 212-226 to the memory hub 208.

As with the aspect discussed above, if the command signals include a write enable signal, the memory device 212-226 is enabled to accept the data signals and write them to the appropriate memory cells indicated by address information contained in the address signals. Otherwise, a read operation is initiated and read data signals from appropriate memory cells in the memory device 112-116 are coupled through the individual buses in the bus system 230-244 coupling the memory device 212-226 to the memory hub 208. Once received in the memory hub 208, the data signals are subsequently converted into signals suitable to be applied to the high speed memory link 203, and it is transmitted to the controller 200 as discussed above. It should be understood that in both aspects described above, the memory hub 208 may access a single bit from each memory device 212-226 or multiple bits as desired.

Figure 3:
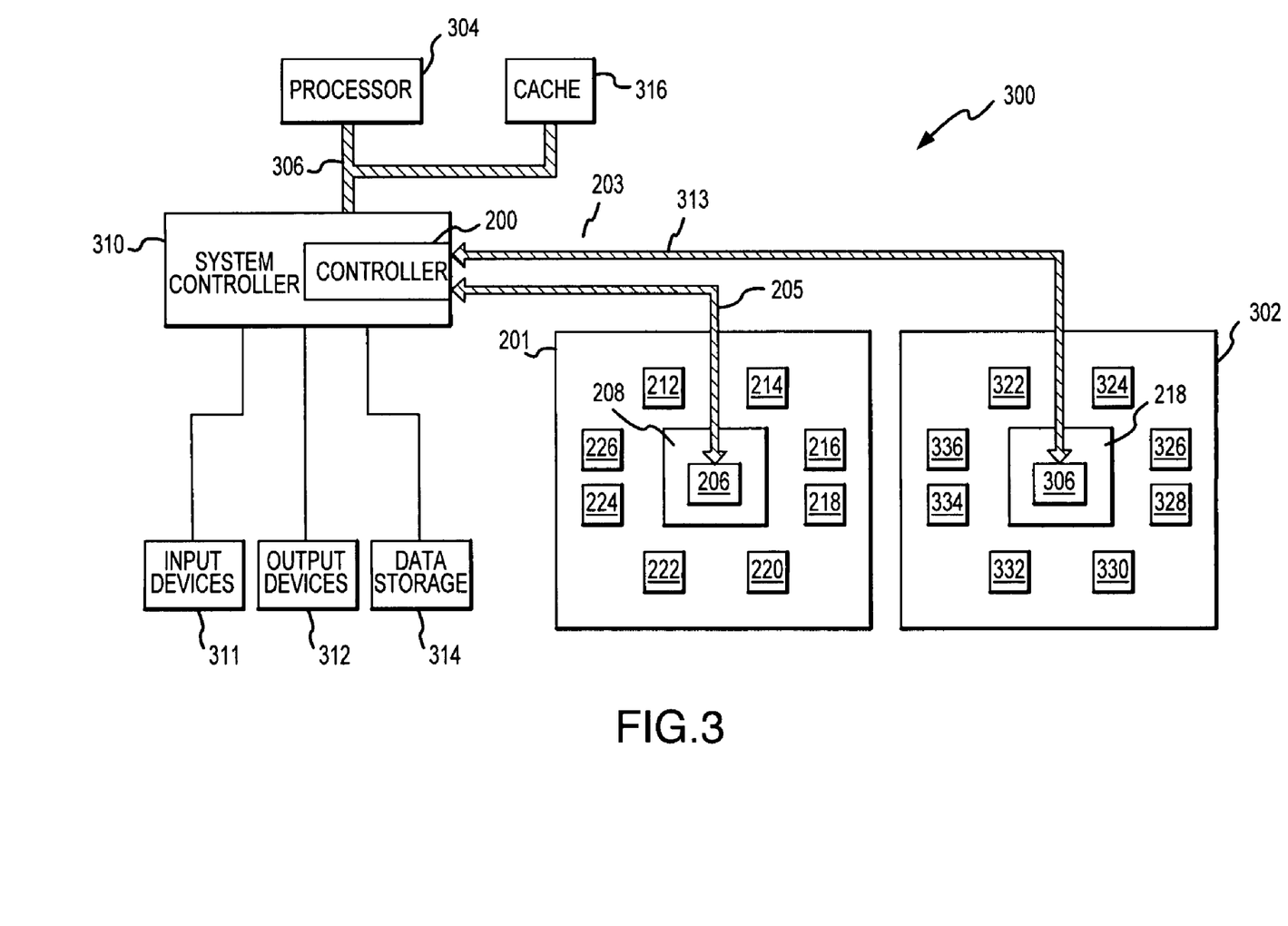
FIG. 3 is a block diagram of a computer system containing several memory modules such as illustrated in FIG. 2 according to one embodiment of the invention.

A computer system 300 using the controller 200 and the memory module 201 of FIG. 2, along with an additional memory module 302, according to one example of the invention is shown in FIG. 3. The computer system 300 includes a processor 304 for performing various computing functions, such as executing specific software to perform specific calculations or tasks. The processor 304 includes a processor bus 306 that normally includes an address bus, a control bus, and a data bus. The computer system 300 includes a system controller 310 that is coupled to the processor bus 306. The system controller 310 also includes the controller 200, which is, in turn, coupled to the memory modules 201, 302 through high speed conduits 205, 313 which comprise the high speed memory link 203. It will be understood that the controller 200 may be external to the system controller 310 and coupled to it or some other component in the computer system 300, such as the processor 304. It will also be understood that the high speed link 203 can have a greater or lesser number of high speed conduits than the two shown in FIG. 3. For example, one high speed conduit may couple both the memory modules 210,301 to the controller 200, or alternately, three or more high speed conduits may couple the memory modules 201, 302 to the controller 200.

Figure 4:
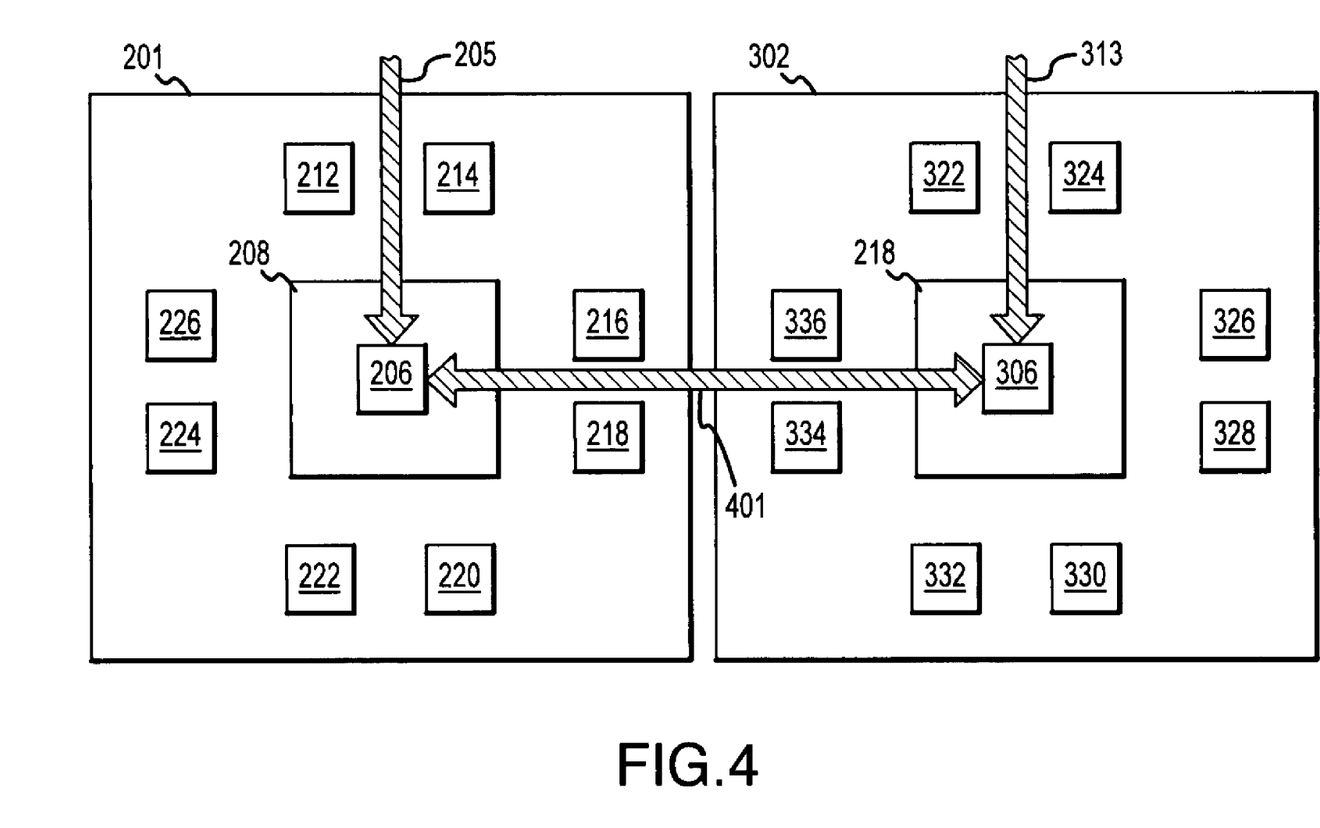
FIG. 4 is a block diagram of a computer system containing several memory modules such as illustrated in FIG. 2 coupled directly to each other according to one embodiment of the invention.

Turning to FIG. 4, memory modules 201, 302 may be directly coupled to each other by a hub communication link 401 coupling interface 206 to interface 306. The hub communication link 401 may be constructed in any of the variations discussed above in conjunction with the high speed memory link 203, including inter alia, one or more point-to-point links, one or more busses, or a combination of point-to-point links and busses. In operation, the hub communication link 401 may transmit command, address, write data and read data signals between memory modules 201 and 302. For example, command, address and write data signals received in memory module 201 from high speed conduit 205, may be transmitted from memory hub 208 to memory hub 218 by coupling the signals to the high speed hub communication link 401. Alternately, command, address and write data signals received in memory module 302 from high speed conduit 313, may be transmitted from memory hub 218 to memory hub 208 by similarly coupling the signals to the hub communication link 401. Communication between the hubs 208, 218 and the controller 200 proceeds in the same manner as described above in regard to FIG. 2.

Returning to FIG. 3, the computer system 300 also includes one or more input devices 311, such as a keyboard, mouse or game controller, coupled to the processor 304 through the system controller 310 to allow an operator to interface with the computer system 300. Typically, the computer system 300 also includes one or more output devices 312 coupled to the processor 114 through the system controller 310, such output devices typically being a printer or a video terminal. One or more data storage devices 314 are also typically coupled to the processor 304 through the system controller 310 to allow the processor 304 to store data or retrieve data from internal or external storage media (not shown). Examples of typical storage devices 314 include hard and floppy disks, tape cassettes, and compact disk read-only memories (CD-ROMs). The processor 304 is also typically coupled to cache memory 316, which is usually static random access memory ("SRAM").

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A memory module comprising;
a substrate;
a memory hub having an outer perimeter, the memory hub arranged on the substrate and operable to receive memory signals;
a plurality of memory devices arranged on the substrate, all of the memory devices arranged on the substrate being substantially equidistant from the outer perimeter of the memory hub and coupled to the memory hub by a respective bus, all of the respective buses having substantially a same length and being substantially perpendicular to the outer perimeter of the memory hub, the length being substantially equal to a shortest distance between the memory hub and the respective memory device.

2. The module of claim 1 wherein the memory hub is located at an interior of the circuit board.

3. The module of claim 2 wherein the plurality of memory devices are located at a periphery of the circuit board.

4. The module of claim 1 wherein the plurality of memory devices comprise more than two memory devices.

5. The module of claim 1 wherein the plurality of memory devices comprise more than four memory devices.

6. The module of claim 1 wherein the memory link port comprises at least one unidirectional high speed port operable to receive at least one of command, address and write data signals.

7. The module of claim 1 wherein the memory link port comprises at least one unidirectional high speed port operable to transmit at least one of command and read data signals.

8. The module of claim 1, wherein the substrate comprises a circuit board.

9. The module of claim 1 wherein the memory hub includes at least one optical transmitter operable to send memory signals and at least one optical receiver operable to receive memory signals, the memory hub being further operable to translate between the optical memory signals and the electrical command, address or data signals.

10. The module of claim 1 wherein the memory module comprises a DIMM.

11. The module of claim 1 wherein the plurality of memory devices comprise DRAM devices.

12. The module of claim 1 wherein each of the memory devices is electrically coupled to the memory hub by a control bus, an address bus and a data bus.

13. The module of claim 1 wherein the memory hub applies command, address or data signals to each of the memory devices simultaneously.

14. The module of claim 1 wherein the memory hub detects address information in a memory signal and applies command, address and data signals to a corresponding memory device.

15. The module of claim 1 wherein the memory hub is positioned at a center of the substrate.

16. A computer system, comprising:
a processor;
a controller electrically coupled to the processor, the controller being operable to receive and transmit memory signals on a memory link; and
a memory module comprising:
a substrate;
a memory hub having an outer perimeter, the memory hub arranged on the substrate and operable to receive memory signals from a memory link port and apply memory signals to the memory link port; and a plurality of memory devices arranged on the substrate, all of the memory devices on the substrate being substantially equidistant from the outer perimeter of the memory hub and coupled to the memory hub by a respective bus, all of the respective buses having substantially a same length and being substantially perpendicular to the outer perimeter of the memory hub, the length being substantially equal to a shortest distance between the memory hub and the respective memory device.

17. The computer system of claim 16 wherein the memory hub is located at an interior of the circuit board.

18. The computer system of claim 17 wherein the plurality of memory devices are located at a periphery of the circuit board.

19. The computer system of claim 16 wherein the plurality of memory devices comprise more than two memory devices.

20. The computer system of claim 16 wherein the plurality of memory devices comprise more than four memory devices.

21. The computer system of claim 16 wherein the memory link port comprises at least one unidirectional high speed port operable to transmit at least one of command, address and write data signals.

22. The computer system of claim 16 wherein the memory link port comprises at least one unidirectional high speed port operable to transmit at least one of command and read data signals.

23. The computer system of claim 16, wherein the substrate comprises a circuit board.

24. The computer system of claim 16 wherein the memory link port comprises an optical port and the memory signals are optical signals, and further wherein the memory hub includes at least one optical transmitter operable to send memory signals and at least one optical receiver operable to receive memory signals, the memory hub being further operable to translate between the optical memory signals and the electrical command, address or data signals.

25. The computer system of claim 16 wherein the memory module comprises a DIMM.

26. The computer system of claim 16 wherein the plurality of memory devices comprise DRAM devices.

27. The computer system of claim 16 wherein each of the memory devices is electrically coupled to the memory hub by a control bus, an address bus and a data bus.

28. The computer system of claim 16 wherein the memory hub applies command, address or data signals to each of the memory devices simultaneously.

29. The computer system of claim 16 wherein the memory hub detects address information in a memory signal and applies command, address and data signals to a corresponding memory device.

30. The computer system of claim 16 wherein the memory hub is positioned at a center of the substrate.

\* \* \* \* \*